(12) United States Patent
Chiang et al.

(10) Patent No.: US 11,302,613 B2
(45) Date of Patent: *Apr. 12, 2022

(54) DOUBLE-SIDED COOLED MOLDED SEMICONDUCTOR PACKAGE

(71) Applicant: Infineon Technologies AG, Neubiberg (DE)

(72) Inventors: Chau Fatt Chiang, Melaka (MY); Swee Kah Lee, Melaka (MY); Josef Maerz, Oberhaching (DE); Thomas Stoek, Buxtehude (DE); Chee Voon Tan, Seremban (MY)

(73) Assignee: Infineon Technologies AG, Neubiberg (DE)

( * ) Notice: Subject to any disclaimer, the term of this patent is extended or adjusted under 35 U.S.C. 154(b) by 13 days.

This patent is subject to a terminal disclaimer.

(21) Appl. No.: 16/924,851

(22) Filed: Jul. 9, 2020

(65) Prior Publication Data
US 2021/0020550 A1  Jan. 21, 2021

Related U.S. Application Data

(63) Continuation-in-part of application No. 16/514,115, filed on Jul. 17, 2019, now Pat. No. 10,886,199.

(51) Int. Cl.
*H01L 23/495* (2006.01)
*H01L 23/31* (2006.01)
(Continued)

(52) U.S. Cl.
CPC .... *H01L 23/49568* (2013.01); *H01L 21/4825* (2013.01); *H01L 21/565* (2013.01);
(Continued)

(58) Field of Classification Search
CPC ............ H01L 23/49517; H01L 23/18; H01L 23/3107; H01L 23/49537; H01L 23/49555;
(Continued)

(56) References Cited

U.S. PATENT DOCUMENTS 7,060,421 B2   6/2006   Naundorf et al.
7,291,380 B2   11/2007  Nyholm et al.
(Continued)

FOREIGN PATENT DOCUMENTS

JP    H11307708 A    11/1999
WO    03036717 A1    5/2003

*Primary Examiner* — David A Zarneke
(74) *Attorney, Agent, or Firm* — Murphy, Bilak & Homiller, PLLC

(57) ABSTRACT

A method of producing a molded semiconductor package includes: attaching a first load terminal at a first side of a semiconductor die to a leadframe, the semiconductor die having a second load terminal at a second side opposite the first side and a control terminal at the first side or the second side; encapsulating the semiconductor die in a laser-activatable mold compound so that the leadframe is at least partly exposed from the laser-activatable mold compound at a first side of the molded semiconductor package, and the second load terminal is at least partly exposed from the laser-activatable mold compound at a second side of the molded semiconductor package opposite the first side; and laser activating a first region of the laser-activatable mold compound to form a first laser-activated region that is electrically conductive.

20 Claims, 12 Drawing Sheets

(51) Int. Cl.
*H01L 21/56* (2006.01)
*H01L 21/48* (2006.01)
*H01L 23/18* (2006.01)

(52) U.S. Cl.
CPC ...... *H01L 23/3114* (2013.01); *H01L 23/4952* (2013.01); *H01L 23/49503* (2013.01); *H01L 23/49562* (2013.01); *H01L 21/56* (2013.01); *H01L 23/18* (2013.01); *H01L 23/3107* (2013.01); *H01L 23/49517* (2013.01); *H01L 23/49537* (2013.01); *H01L 23/49555* (2013.01); *H01L 23/49558* (2013.01); *H01L 23/49575* (2013.01)

(58) Field of Classification Search
CPC ......... H01L 23/49558; H01L 23/49568; H01L 23/49575; H01L 21/56
See application file for complete search history.

(56) References Cited

U.S. PATENT DOCUMENTS

| | | |
|---|---|---|
| 7,632,753 B1 | 12/2009 | Rusli et al. |
| 8,642,387 B2 | 2/2014 | Tam et al. |
| 8,952,509 B1 | 2/2015 | Yilmaz et al. |
| 9,330,944 B2 | 5/2016 | Smith et al. |
| 9,922,843 B1 | 3/2018 | Sirinorakul et al. |
| 10,396,007 B2 | 8/2019 | Chan et al. |
| 10,424,525 B2 | 9/2019 | Ziglioli |
| 10,448,518 B2 | 10/2019 | Choi et al. |
| 10,549,985 B2 | 2/2020 | Maier et al. |
| 10,741,466 B2 | 8/2020 | Danny Koh et al. |
| 10,886,199 B1 * | 1/2021 | Chiang ............ H01L 21/56 |
| 2007/0161151 A1 | 7/2007 | Madrid et al. |
| 2010/0307799 A1 | 12/2010 | Chiang |
| 2018/0096975 A1 | 4/2018 | Hua et al. |
| 2020/0185293 A1 | 6/2020 | Schmalzl et al. |
| 2020/0203264 A1 | 6/2020 | Ziglioli |

* cited by examiner

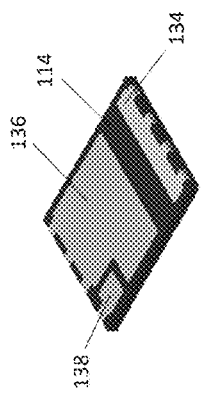
Figure 1H
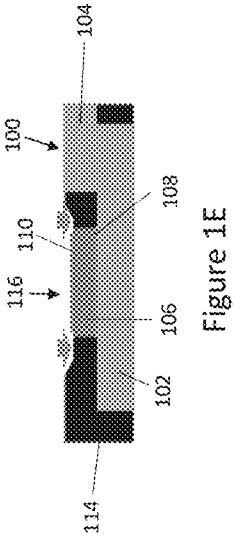
Figure 1E
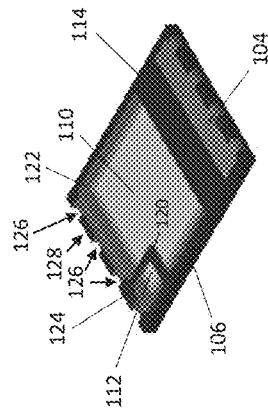
Figure 1F
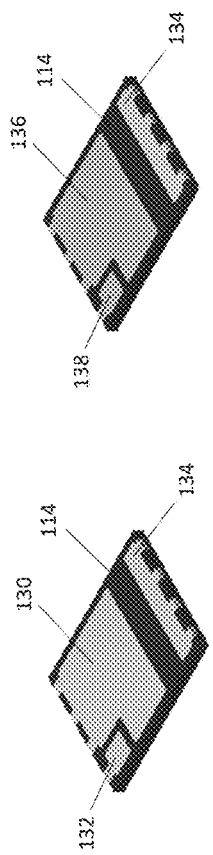
Figure 1G
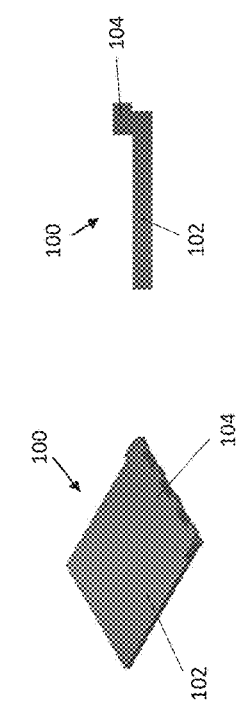
Figure 1B
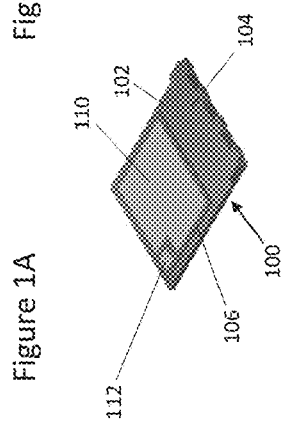
Figure 1A
Figure 1C
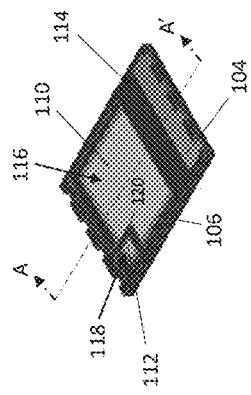
Figure 1D

DOUBLE-SIDED COOLED MOLDED SEMICONDUCTOR PACKAGE

BACKGROUND

Thermal performance and scalability are important factors for molded semiconductor packages. Many types of molded semiconductor packages use a metal clip in place of multiple bond wire connections, enhancing thermal performance. However, clip dimensions and contact area depend on chip (die) size, leading to higher manufacturing line complexity due to a high number of clip design requirements for various types of chips processed by the same line. Also, the cost associated with forming metal clips by etching is a major influencing factor on overall package cost. Converting to stamped metal clips offers lower cost, but requires high enough production volume to justify the investment in the tooling needed for stamping the metal clips. For double sided cooling, additional processes are needed to expose the metal clip, further increasing line complexity and overall package cost.

Thus, there is a need for a molded semiconductor package with improved thermal performance and scalability and a production method for producing such a molded semiconductor package in a more efficient manner.

SUMMARY

According to an embodiment of a method of producing a molded semiconductor package, the method comprises: attaching a first load terminal at a first side of a semiconductor die to a leadframe, the semiconductor die having a second load terminal at a second side opposite the first side and a control terminal at the first side or the second side; encapsulating the semiconductor die in a laser-activatable mold compound so that the leadframe is at least partly exposed from the laser-activatable mold compound at a first side of the molded semiconductor package, and the second load terminal is at least partly exposed from the laser-activatable mold compound at a second side of the molded semiconductor package opposite the first side; and laser activating a first region of the laser-activatable mold compound to form a first laser-activated region which forms part of an electrical connection to the second load terminal.

According to an embodiment of a molded semiconductor package, the molded semiconductor package comprises: a semiconductor die having a first load terminal at a first side, a second load terminal at a second side opposite the first side, and a control terminal at the first side or the second side; a leadframe attached to the first load terminal of the semiconductor die; and a laser-activatable mold compound encapsulating the semiconductor die so that the leadframe is at least partly exposed from the laser-activatable mold compound at a first side of the molded semiconductor package, and the second load terminal is at least partly exposed from the laser-activatable mold compound at a second side of the molded semiconductor package opposite the first side, wherein the laser-activatable mold compound comprises a first laser-activated region which forms part of an electrical connection to the second load terminal.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A through 1H illustrate different views of an embodiment of a molded semiconductor package during different stages of the production process.

DETAILED DESCRIPTION

Figure 2:
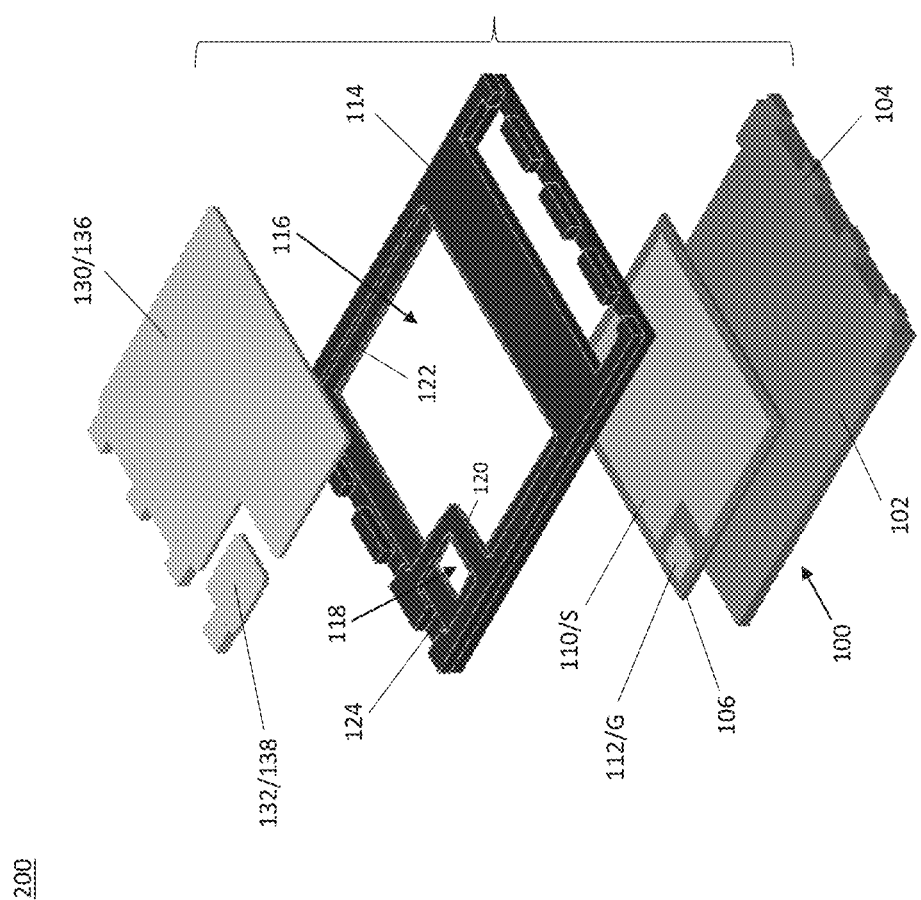
FIG. 2 illustrates an exploded view of a molded semiconductor package produced by the method illustrated in FIGS. 1A through 1H.

The embodiments described herein provide a molded semiconductor package with improved thermal performance and scalability, and a production method for producing the molded semiconductor package in a more efficient manner. The molded semiconductor package includes a laser-activatable mold compound in which at least one semiconductor die is embedded. The leadframe to which the semiconductor die is attached is at least partly exposed from the mold compound at a first side of the semiconductor package, and a load terminal of the semiconductor die is at least partly exposed from the mold compound at a second side of the semiconductor package opposite the first side. A region of the laser-activatable mold compound is laser activated, so that in a plating step or during deposition of conductive paste the plating material or paste is deposited on the laser activated region but not the non-activated parts of the mold compound, and therefore the laser activated region defines the region that is electrically conductive. The laser-activated region of the mold compound forms part of an electrical connection to the load terminal of the semiconductor die which is at least partly exposed from the mold compound at the second side of the semiconductor package. The laser-activated region of the mold compound is used instead of a metal clip to form the electrical connection to the load terminal of the semiconductor die which is at least partly exposed from the mold compound at the second side of the semiconductor package.

FIGS. 1A through 1H illustrate an embodiment of a molded semiconductor package during different stages of the production process. FIG. 1A illustrates a top perspective view of a leadframe 100, and FIG. 1B illustrates a side view of the leadframe 100. The leadframe 100 includes a base (die pad) region 102 and a lead region 104 extending from the base region 102. The leadframe 100 may be formed, e.g., by stamping and/or etching.

FIG. 1C illustrates the same top perspective view as FIG. 1A, after a semiconductor (chip) die 106 is attached to the base region 102 of the leadframe 100. The semiconductor die 106 may be attached to the base region 102 of the leadframe 100 using any die attach material or process such soldering, diffusion soldering, sintering, gluing, etc. More than one semiconductor die 106 may be attached to the same base region 102 of the leadframe 100 and/or the semiconductor package may include more than one leadframe 102 with one or more semiconductor dies 106 attached to each the base region 102 of each leadframe 100. In one embodiment, the semiconductor die is a power semiconductor die such as a power MOSFET (metal-oxide-semiconductor field effect transistor), IGBT (insulated gate bipolar transistor), HEMT (high-electron mobility transistor), etc., and has a first load terminal 108 at the back side of the die 106 and attached to the base region 102 of the leadframe 100, a second load terminal 110 at the front side of the die 106, and a control terminal 112 at the front side of the die 106.

In the case of a power MOSFET or HEMT, the first load terminal 108 at the back side of the die 106 may be a drain terminal and the second load terminal 110 at the front side of the die 106 may be a source terminal. In the case of an IGBT, the first load terminal 108 at the back side of the die 106 may be a collector terminal and the second load terminal 110 at the front side of the die 106 may be an emitter terminal. In either case, the control terminal 112 may be a gate terminal. The lead region 104 of the leadframe 100 brings an electrical connection for the first load terminal 108 at the back side of the die 106 to the same side of the package as the second load terminal 110 and the gate terminal 112.

In one embodiment, the base region 102 of the leadframe 100 is thinner than the lead region 104. The leadframe 100 may be of a single, continuous construction and the base region 102 may be made thinner than the lead region 104 by, e.g., etching. According to this embodiment, the first load terminal 108 at the back side of the semiconductor die 106 is attached to a thinner region 102 of the leadframe 100 and the thicker region 104 of the leadframe 102 is at least partly exposed from the laser-activatable mold compound 114 at the opposite side of the molded semiconductor package. For example, the semiconductor die 106 may be a power semiconductor die, the first load terminal may be a drain terminal, the second load terminal may be a source terminal, and the control terminal is at the same side of the semiconductor die 106 as the source terminal. In this example, a vertical extension of the leadframe 100 provided by the lead region 104 brings an electrical connection for the drain terminal from one side of the molded semiconductor package to the opposite side of the semiconductor package, so that the package may have a source-down mounting configuration at the second side of the molded semiconductor package.

FIG. 1D illustrates the same top perspective view as FIG. 1C, after encapsulating the semiconductor die 106 in a laser-activatable mold compound 114. FIG. 1E illustrates a corresponding cross-sectional view along the line labelled A-A' in FIG. 1D. The base region 102 of the leadframe 100 is at least partly exposed from the laser-activatable mold compound 114 at the bottom side of the semiconductor package, and the second load terminal 110 at the front side of the semiconductor die 106 is at least partly exposed from the laser-activatable mold compound 114 at the front side of the semiconductor package.

Any typical molding process such as injection molding, compression molding, film-assisted molding (FAM), reaction injection molding (RIM), resin transfer molding (RTM), map molding, blow molding, etc. may be used to embed the semiconductor die 106 in the mold compound 114. Common mold compounds and resins include, but are not limited to, thermoset resins, gel elastomers, encapsulants, potting compounds, composites, optical grade materials, etc.

The mold compound 114 is a laser-activatable in that the mold compound 114 includes at least one additive, e.g., in the form of an organic metal complex which is activatable by a physio-chemical reaction induced by a focused laser beam. The reaction cracks open the complex compounds in the mold compound 114 and breaks off metal atoms from the organic ligands. The freed metal atoms act as nuclei for metal or metal alloy (e.g. Cu, Ni, NiP, Au, Cu/Ni/Au stack, etc.) coating/plating in each region of the mold compound 114 activated by a laser.

In one embodiment, a first cavity 116 is formed in the laser-activatable mold compound 114 and which exposes at least part of the second load terminal 110 at the front side of the semiconductor die 106. A second cavity 118 also may be formed in the laser-activatable mold compound 114 and which exposes at least part of the control terminal 112 at the front side of the semiconductor die 106. The first and second cavities 116, 118 are separated from one another by a section 120 of the laser-activatable mold compound 114 formed on the front side of the semiconductor die 106 between the second load terminal 110 and the control terminal 112. The first and second cavities 116, 118 may be formed in the laser-activatable mold compound 114 as part of the molding process or post-molding.

FIG. 1F illustrates the same top perspective view as FIG. 1D, after laser activating a first region of the laser-activatable mold compound 114 bordering the second load terminal 110 at the front side of the semiconductor die 106, to form a first laser-activated region 122 which forms part of an electrical connection to the second load terminal 110. The laser activating is indicated by downward facing arrows in FIG. 1E. In some embodiments, the first and second cavities 116,118 may be formed by using a laser to remove the mold compound from the regions in the first and second cavities 116,118. In this case, the same laser may be used, with a lower intensity or lower time, to activate the laser-activatable mold compound 114.

A second region of the laser-activatable mold compound 114 bordering the control terminal 112 of the semiconductor die 106 may also be laser activated, to form a second laser-activated region 124 which forms part of an electrical connection to the control terminal 112. The term "laser-activated region" as used herein means a region of the laser-activatable mold compound 114 which has already been activated by a laser beam, as opposed to a laser-activatable region of the mold compound 114 which is capable of being activated by laser light but has yet to actually be activated.

The laser-activation provides a surface of mold compound that plating material may adhere to. Thus, during a plating step, the plating material adheres to the laser-activated regions 122, 124 but not to other regions of the mold compound. The plating may be for example 1 to 50 μm, in embodiments 2 to 20 μm and in particular 4 to 10 μm of for example copper or NiPAu.

Embodiments may provide a metal layer of up to 100 μm, for example up to 50 μm. Such a layer may be provided by plating. In alternative embodiments, after plating a metal plating layer, for example 4 to 10 μm of metal, a conductive paste may be deposited. The conductive paste adheres to the metal plating layer in the laser-activated regions 122, 124 but not to the mold compound outside the laser-activated region. In embodiments, conductive paste may be used to more quickly achieve a required thickness, for example up to 50 or even up to 100 μm, as compared to using plating.

In one embodiment, notches 126 are formed in an edge 128 of the laser-activatable mold compound 114. The notches 126 may be formed as part of the molding process or post-molding. In either case, the notches 126 and the section of the laser-activatable mold compound 114 interposed between the notches 126 and the second load terminal 110 at the front side of the semiconductor die 106 are laser activated to form the first laser-activated region 122 of the mold compound 114.

FIG. 1G illustrates the same top perspective view as FIG. 1F, after plating the first laser-activated region 122 of the mold compound 114 with an electrically conductive material 130. The electrically conductive material 130 plates the first-laser activated region 122 of the mold compound 114 as well as the exposed upper surface of the second load terminal 110 to form a contact to define an electrical connection to the second load terminal 110 at the front side of the semiconductor die 106. The second laser-activated region 124 of the mold compound 114 as well as the control terminal 112 also may be plated with an electrically conductive material 132, to define the electrical connection to the control terminal 112 at the front side of the semiconductor die 106. The exposed top side of the lead region 104 of the leadframe 100 may also be plated with an electrically conductive material 134. It will be appreciated by those skilled in the art that a single electroless plating step may be used to form the electrically conductive materials 130, 132, 134 which will deposit only on metal or on laser-activated regions of the laser-activatable mold compound 114.

FIG. 1H illustrates an alternative to what is shown in FIG. 1G. According to the embodiment illustrated in FIG. 1H, the first cavity 116 in the laser-activatable mold compound 114 is filled with an electrically conductive paste 136 such as solder paste which is solidified to complete the electrical connection to the second load terminal 110 at the front side of the semiconductor die 106. The paste 136 extends over the first laser-activated region 122 of the mold compound 114 but not the non-activated regions. Similarly, the second cavity 118 in the laser-activatable mold compound 114 is also filled with an electrically conductive paste 138 such as solder paste which is solidified to complete the electrical connection to the control terminal 112 at the front side of the semiconductor die 106. The paste 138 extends over the second laser-activated region 124 of the mold compound 114 but not the non-activated regions. The electrically conductive paste 136, 138 may be applied directly to the second load terminal 110 and the control terminal 110 at the front side of the semiconductor die 106, or the second load terminal 110 and the control terminal 110 may be plated, e.g., with 4 to 7 or 5 to 10 μm (micron) of metal followed by filling with the electrically conductive paste 136, 138.

The resulting molded semiconductor package has double-sided cooling in that the base region 102 of the leadframe 100 provides cooling at one side of the package and the metallized parts 130/136, 132/138 of the laser-activatable mold compound 114 provides cooling at the opposite side of the package.

FIG. 2 illustrates an exploded view of a molded semiconductor package 200 produced by the method illustrated in FIGS. 1A through 1H. The molded semiconductor package 200 includes at least one semiconductor die 106 having a first load terminal (out of view in FIG. 2) at the back side of the die 106, a second load terminal 110 at the front side of the die 106, and a control terminal 112 at the front or back side of the die 106. A leadframe 100 is attached to the first load terminal at the back side of the semiconductor die 106. A laser-activatable mold compound 114 encapsulates the semiconductor die 106, so that the leadframe 100 is at least partly exposed from the laser-activatable mold compound 114 at the bottom side of the molded semiconductor package 200 and the second load terminal 110 at the front side of the semiconductor die 106 is at least partly exposed from the laser-activatable mold compound 114 at the front side of the molded semiconductor package 200. The laser-activatable mold compound 114 comprises a first laser-activated region 122 which forms part of an electrical connection to the second load terminal 110 at the front side of the semiconductor die 106, and a second laser-activated region 124 which forms part of an electrical connection to the control terminal 112 at the front side of the die 106. As illustrated in FIGS. 1G and 1H, the electrically conductive material 130, 132 and/or paste 136, 138 on the respective terminals 110,112 forms the upper surface of the finished package 200.

Figure 3:
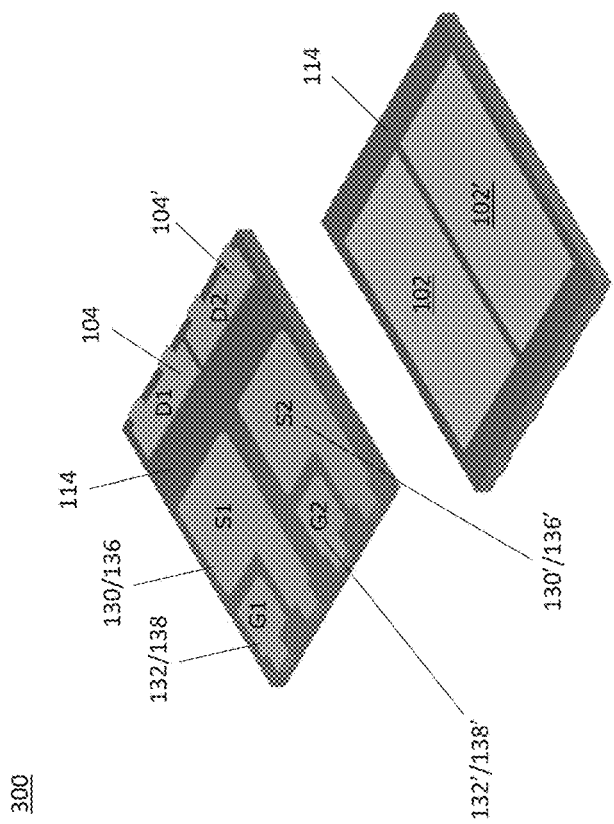
FIG. 3 illustrates different perspective views of another embodiment of a molded semiconductor package which may be produced by the method illustrated in FIGS. 1A through 1H.

FIG. 3 illustrates top (upper diagram) and bottom (lower diagram) perspective views of another embodiment of a molded semiconductor package 300 which may be produced by the method illustrated in FIGS. 1A through 1H. The molded semiconductor package 300 is similar to the molded semiconductor package 200 illustrated in FIG. 2. Different, however, the molded semiconductor package 300 further includes a second semiconductor die (out of view in FIG. 3) attached to the base region 102' of a second leadframe (out of view in FIG. 3). Each semiconductor die forms part of a separate channel configured to deliver current to a load, according to this embodiment. Each channel may be controlled independently of the other, and one channel may be deactivated, e.g., under light-load conditions.

In the case of power MOSFETs or HEMTs, the drain terminal at the back side of the respective semiconductor dies is attached to the base region 102, 102' of the corresponding leadframe. A laser-activatable mold compound 114 encapsulates the semiconductor dies so that the base region 102, 102' of each leadframe is at least partly exposed from the laser-activatable mold compound 114 at the bottom side of the molded semiconductor package 300. The source terminal (out of view in FIG. 3) at the front side of each semiconductor die is at least partly exposed from the laser-activatable mold compound 114 at the front side of the molded semiconductor package 300. The laser-activatable mold compound 114 includes respective first laser-activated regions (out of view in FIG. 3) which are plated and/or coated with a solidified electrically conductive material 130/136, 130'/136' to form part of an electrical connection to the source terminal at the front side of the corresponding semiconductor die. The source connection for the first channel is labelled S1 in FIG. 3, and the source connection for the second channel is labelled S2 in FIG. 3.

The lead region 104, 104' of each leadframe is at least partly exposed from the laser-activatable mold compound 114 at the top side of the molded semiconductor package 300 to form respective drain connections. The drain connection for the first channel is labelled D1 in FIG. 3, and the drain connection for the second channel is labelled D2 in FIG. 3. The laser-activatable mold compound 114 also includes respective second laser-activated regions (out of view in FIG. 3) which are plated and/or filled with a solidified electrically conductive material 132/138, 132'/138' to form part of an electrical connection to the gate terminal at the front side of the corresponding semiconductor die. The gate connection for the first channel is labelled G1 in FIG. 3, and the gate connection for the second channel is labelled G2 in FIG. 3.

Figure 4:
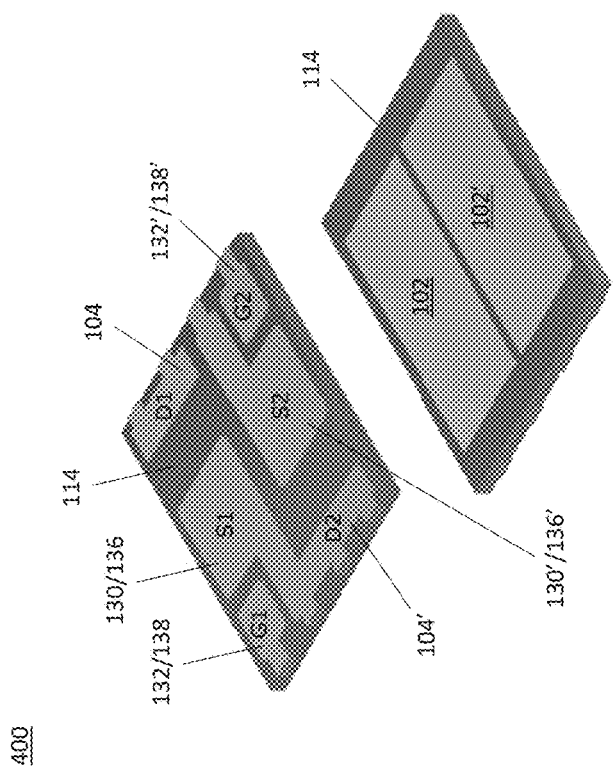
FIG. 4 illustrates different perspective views of another embodiment of a molded semiconductor package which may be produced by the method illustrated in FIGS. 1A through 1H.

FIG. 4 illustrates top (upper diagram) and bottom (lower diagram) perspective views of another embodiment of a molded semiconductor package 400 which may be produced by the method illustrated in FIGS. 1A through 1H. The molded semiconductor package 300 is similar to the molded semiconductor package 200 illustrated in FIG. 2. Different, however, the semiconductor dies are electrically coupled in a half bridge configuration. For example, the first laser-activated region (out of view in FIG. 4) of the laser-activatable mold compound 114 which forms part of the electrical connection to the source terminal of the first semiconductor die may adjoin the lead region 104' of the second leadframe. The electrically conductive material 130/136 that plates and/or fills the first laser-activated region of the mold compound 114 which forms part of the electrical connection to the source terminal of the first semiconductor die adjoins the lead region 104' of the second leadframe at the front side of the package 400, electrically connecting the source terminal of the first semiconductor die to the drain terminal of the second semiconductor die in a half bridge configuration and without using a metal clip. The gate connections G1, G2 may be provided at opposite ends of the package 400, e.g., as shown in FIG. 4.

Figure 5:
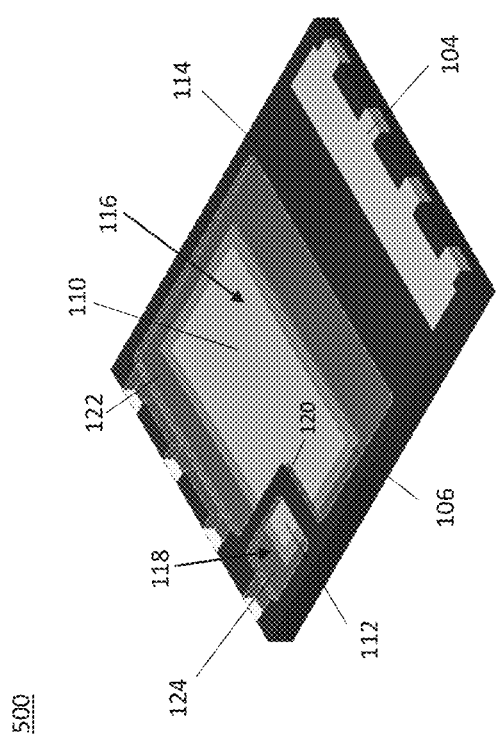
FIG. 5 illustrates a perspective view of another embodiment of a molded semiconductor package which may be produced by the method illustrated in FIGS. 1A through 1H, prior to cavity filling.

FIG. 5 illustrates a perspective view of another embodiment of a molded semiconductor package 500 which may be produced by the method illustrated in FIGS. 1A through 1H, prior to plating and/or filling the cavities 116, 118 in the laser-activatable mold compound 114 with an electrically conductive material. The embodiment shown in FIG. 5 is similar to the embodiment shown in FIG. 2. Different, however, the semiconductor die has a smaller footprint (smaller width and/or smaller length). The semiconductor die 106 with the different footprint can be easily accommodated without requiring a different metal clip design. Since laser-activated regions 122, 124 of the mold compound 114 are used to enable electrical connections at one side of the package 500, the laser processing can be adjusted as needed to accommodate different size dies 106, or the same package footprint may be used for different size dies 102

Figures 6A, 6B, 6C:
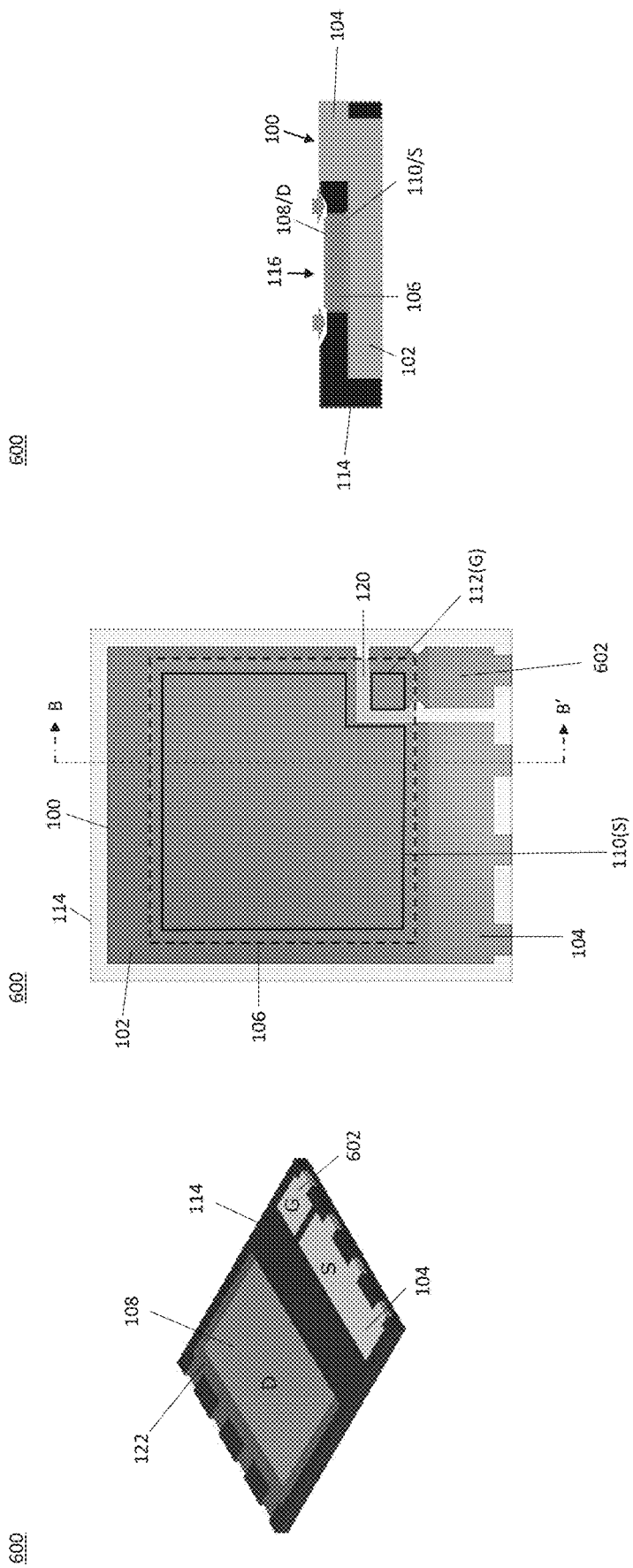
FIGS. 6A through 6C illustrate different views of another embodiment of a molded semiconductor package which may be produced by the method illustrated in FIGS. 1A through 1H, prior to cavity filling.

FIGS. 6A through 6C illustrate different views of another embodiment of a molded semiconductor package 600 which may be produced by the method illustrated in FIGS. 1A through 1H, prior to plating and/or filling the cavities 116, 118 in the laser-activatable mold compound 114 with an electrically conductive material. FIG. 6A is a top perspective view, FIG. 6B is a top plan view, and FIG. 6C is a cross-sectional view along the line labelled B-B' in FIG. 6B.

The embodiment shown in FIGS. 6A through 6C is similar to the embodiment shown in FIG. 2. Different, however, the molded semiconductor package 600 has a drain-down mounting configuration instead of a source-down mounting configuration. According to this embodiment, one region 122 of the laser-activatable mold compound 114 is activated by laser energy and contains freed metal atoms which act as nuclei for metal or metal alloy coating/plating, thereby forming part of the electrical connection to the drain (D) terminal 108 of the semiconductor die 106 at the bottom side of the molded semiconductor package 600. The laser activation of the mold compound 114 is indicated by downward facing arrows in FIG. 6C.

The source (S) and control (G) terminals are at the opposite side of the semiconductor die 106, as is the case in FIG. 2. Unlike the embodiment in FIG. 2 according to which the leadframe 100 brings the electrical connection to the drain terminal 108 to the same side of the package 200 as the source and control terminals 110, 112, the electrical connections to the source and control terminals 110, 112 for the package 600 shown in FIGS. 6A through 6C are instead brought to the same side of the die 106 as the drain terminal 108. Particularly, the source terminal 110 is attached to the base region 102 of the leadframe 100 and the control terminal 112 is attached to a separate metal lead 602 at the top side of the molded semiconductor package 600. The vertical extension of the separate metal lead 602 brings the electrical connection for the control terminal 112 from the top side of the molded semiconductor package 600 to the bottom side of the package 600, where the drain connection is provided. The vertical extension of the leadframe 100 provided by the lead region 104 similarly brings the electrical connection for the source terminal 110 from the top side of the molded semiconductor package 600 to the bottom side of the semiconductor package 600, so that the package 600 has a drain-down mounting configuration.

Figure 7:
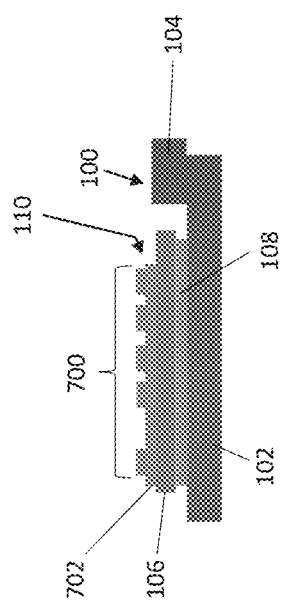
FIG. 7 illustrates a cross-sectional view of an embodiment of a semiconductor die attached to a leadframe.

FIG. 7 illustrates a cross-sectional view of an embodiment of the semiconductor die 106 attached to the leadframe 100. According to this embodiment, the second load terminal 110 includes one or more Cu pillars 700 attached to a bond pad 702 at the top side of the semiconductor die 106. Laser-activatable mold compound may be deposited, leaving the tops of the Cu pillars 700 exposed. The upper surface of the laser-activatable mold compound may then be laser activated. The first laser-activated region 122, which is not yet formed in FIG. 7 but visible in FIGS. 1F, 2, 5 and 6A, is formed around each Cu pillar 700 to complete the electrical connection to the second load terminal 110. In the embodiment shown in FIG. 6A, the electrical connection is a single region extending across all of the Cu pillars 700.

Figure 8:
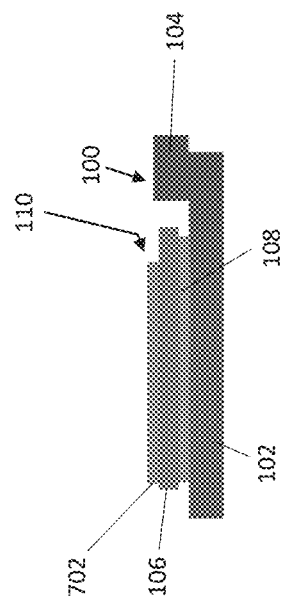
FIG. 8 illustrates a cross-sectional view of another embodiment of a semiconductor die attached to a leadframe.

FIG. 8 illustrates a cross-sectional view of another embodiment of the semiconductor die 106 attached to the leadframe 100. According to this embodiment, the second load terminal 110 is devoid of more Cu pillars and the first laser-activated region 122, which is not yet formed in FIG. 8 but visible in FIGS. 1F, 2, 5 and 6A, contacts the bond pad 702 to complete the electrical connection to the second load terminal 110.

Figure 9B:
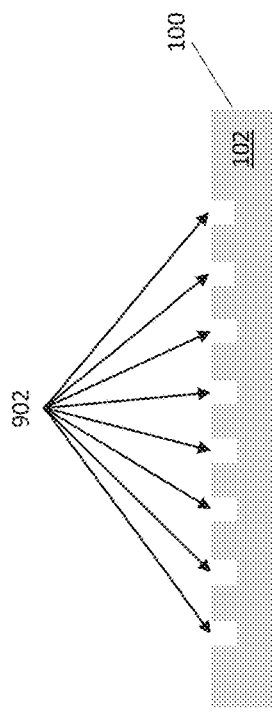
FIG. 9B illustrates a cross-sectional view of a base region of the leadframe patterned with grooves.
Figure 9A:
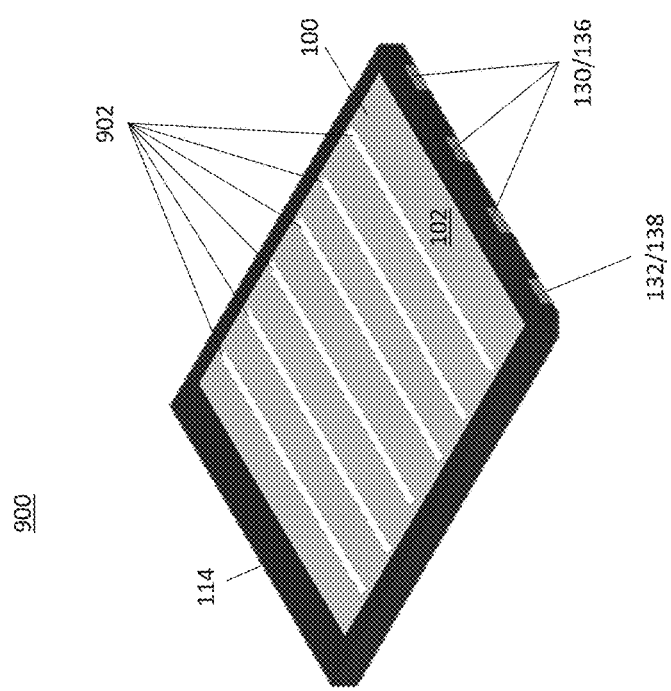
FIG. 9A illustrates a bottom perspective view of another embodiment of a molded semiconductor package which may be produced by the method illustrated in FIGS. 1A through 1H.

FIG. 9A illustrates a bottom perspective view of another embodiment of a molded semiconductor package 900 which may be produced by the method illustrated in FIGS. 1A through 1H. According to this embodiment, the exposed part of the base region 102 of the leadframe 100 at the bottom side of the molded semiconductor package 900 is patterned to increase thermal efficiency of the leadframe 100. The base region 102 may be patterned before or after molding, e.g., by etching, stamping, etc. In one embodiment, grooves 902 are formed in the exposed part of the base region 102. FIG. 9B illustrates a cross-sectional view of the base region 102 of the leadframe 100 with grooves 902 patterned into the exposed (bottom) side.

Figure 10C:
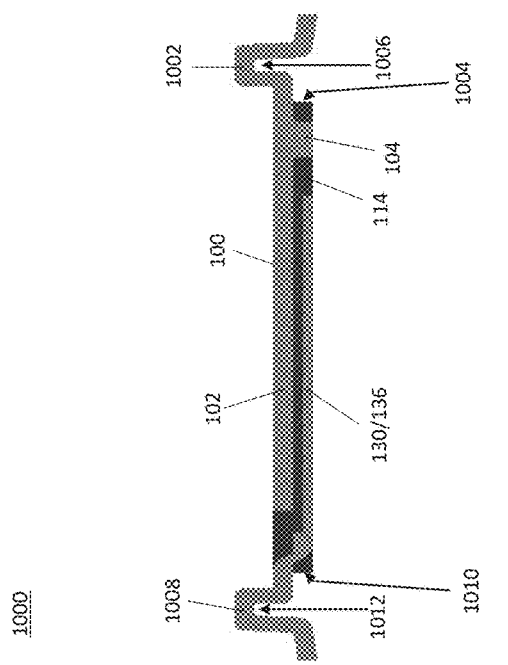
FIGS. 10A through 10C illustrate different views of another embodiment of a molded semiconductor package which may be produced by the method illustrated in FIGS. 1A through 1H.
Figure 10B:
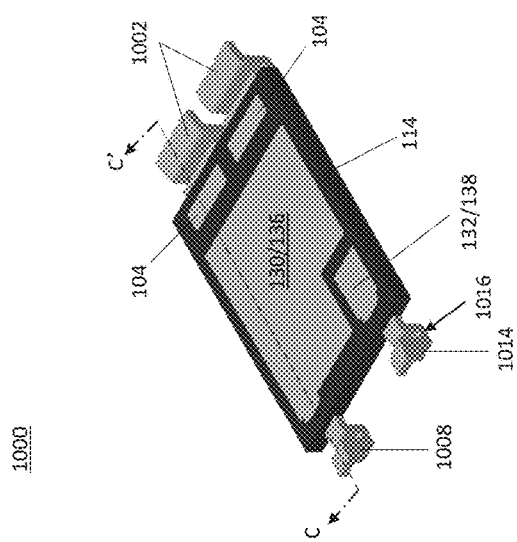
Figure 10A:
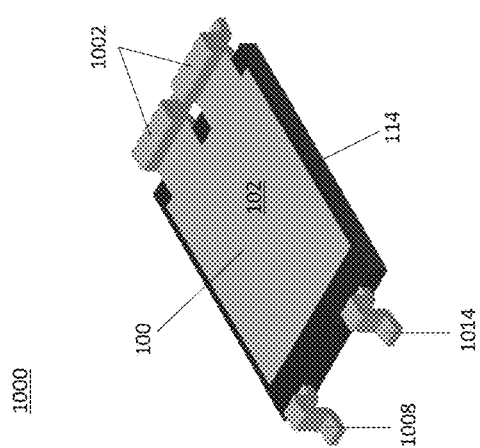

FIGS. 10A through 10C illustrate different views of another embodiment of a molded semiconductor package 1000 which may be produced by the method illustrated in FIGS. 1A through 1H. FIG. 10A is a top perspective view, FIG. 10B is a bottom perspective view, and FIG. 10C is a cross-sectional view along the line labelled C-C' in FIG. 10B. According to this embodiment, the leadframe 100 comprises first leads 1002 which protrude from a first side face 1004 of the molded semiconductor package 1000. The first leads 1002 are bent so as to comprise at least one folded fin 1006. The folded fin 1006 provides improved cooling and the package is still configured for surface mounting. The first leads 1002 may be of the gull-wing type by extending slightly out of the first side face 1004 of the molded semiconductor package, down and then out again. That is, the first leads 1002 may have a gull wing configuration with at least one folded fin 1006.

In one embodiment, the first leads 1002 are electrically connected to the first load terminal 108 at the back side of the semiconductor die 106 (out of view) and form a gull wing pad. For example, the first leads 1002 may be integrally connected to the lead region 104 of the leadframe 100. In one embodiment, the first leads 1002 are of the gull-wing type and the lead region 104 of the leadframe 100 forms a land grid pad at the same side of the package 1000 as the gull-wing type leads. The second load terminal 110 at the opposite side of the die 106 (also out of view) may form a land grid pad via the electrically conductive material 130/136, 130'/136' which forms part of the electrical connection to the second load terminal 110.

The leadframe 100 may also include one or more second leads 1008 which protrude from a second side face 1010 of the molded semiconductor package 1000 opposite the first side face 1004. The second leads 1002 may be bent so as to comprise at least one folded fin 1012. The second leads 1008 may be of the gull-wing type, and are electrically connected to the second load terminal 110 at the top side of the semiconductor die 106 via the electrically conductive material 130/136 which forms part of the electrical connection to the second load terminal 110.

The leadframe 100 may similarly include a third lead 1014 which protrudes from the second side face 1010 of the molded semiconductor package 1000. The third lead 1014 may be bent so as to comprise at least one folded fin 1016. The third lead 1012 may be of the gull-wing type, and is electrically connected to the control terminal 112 at the top side of the semiconductor die 106 (out of view) via the electrically conductive material 132/138 which forms part of the electrical connection to the control load terminal 112.

Figure 11C:
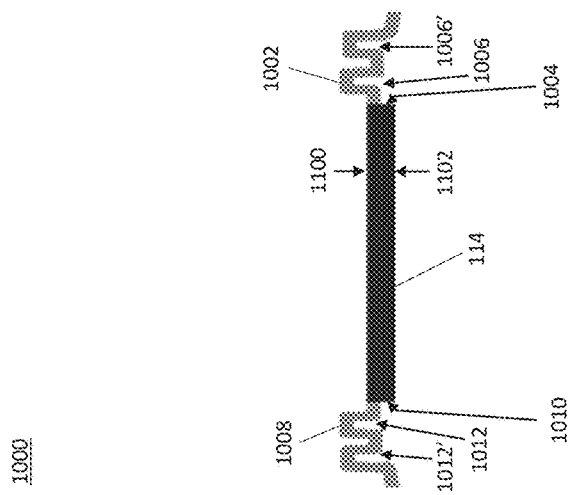
FIGS. 11A through 11C illustrate respective side views of the molded semiconductor package in FIGS. 10A through 10C, with different lead configurations.
Figure 11B:
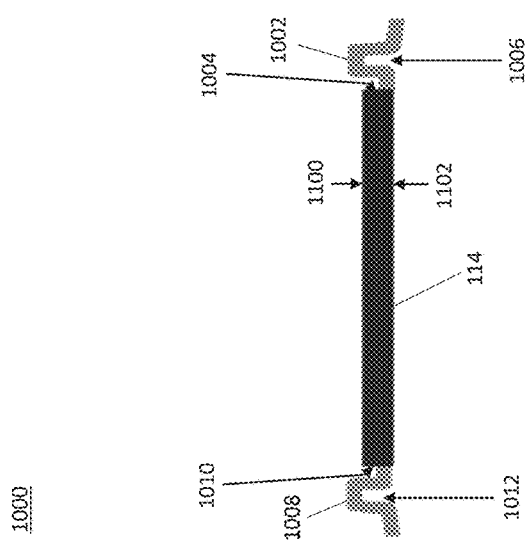
Figure 11A:
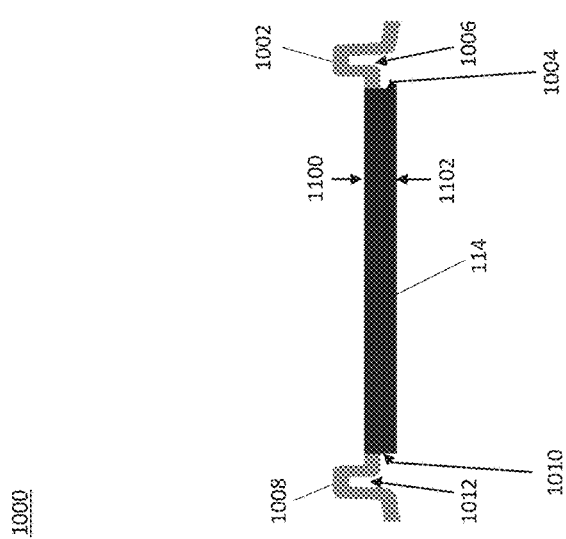

FIGS. 11A through 11C illustrate respective side views of the molded semiconductor package 1000, with different lead configurations. In FIG. 11A, the leads 1002, 1008, 1014 of the leadframe 100 protrude from the respective side faces 1004, 1010 of the molded semiconductor package 1000 at or near the top side 1100 of the molded semiconductor package 1000. In FIG. 11B, the leads 1002, 1008, 1014 of the leadframe 100 protrude from the respective side faces 1004, 1010 of the molded semiconductor package 1000 at or near the bottom side 1102 of the molded semiconductor package 1000. In FIG. 11C, the leads 1002 have at least two folded fins 1006, 1006', 1012, 1012', respectively. The third lead 1012, which is electrically connected for the control terminal 112 of the semiconductor die 106, is out of view in FIGS. 11A through 11C.

Figure 12B:
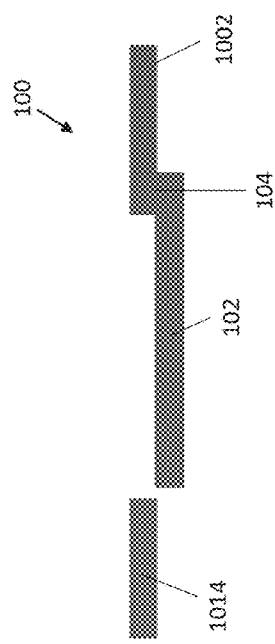
FIGS. 12A through 12G illustrate different views of another embodiment of a molded semiconductor package during different stages of the production process.
Figure 12D:
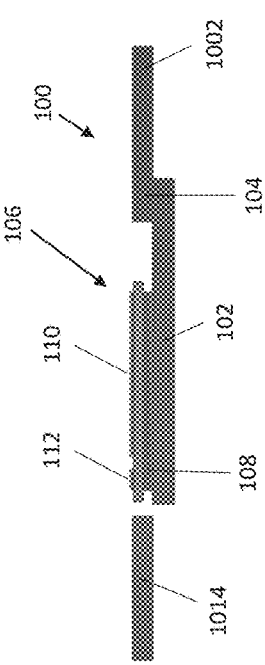
Figure 12A:
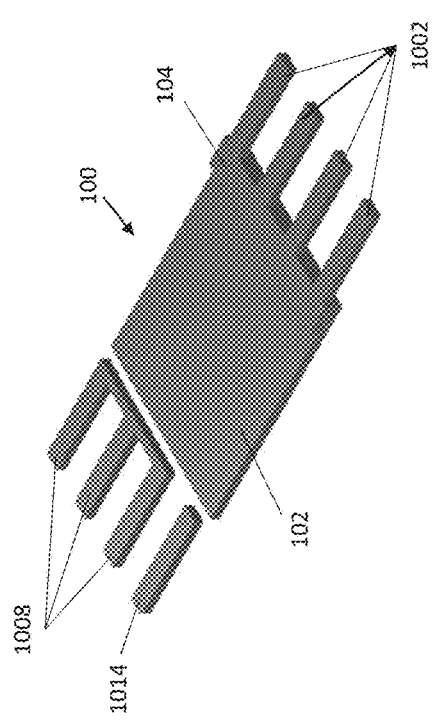

FIGS. 12A through 12G illustrate an embodiment of producing a molded semiconductor package of the kind described herein, with leads protruding form opposing side faces to the package. FIG. 12A illustrates a top perspective view of a leadframe 100, and FIG. 12B illustrates a side view of the leadframe 100. The leadframe 100 includes a base region 102 and a lead region 104 extending from and integrally formed with the base region 102.

The leadframe also includes first leads 1002 integrally connected to the lead region 104 of the leadframe 100. The leadframe further includes second leads 1008 and a third lead 1014 at the opposite end of the lead frame 100 as the first leads 1002. The leadframe 100 may be formed, e.g., by stamping and/or etching.

Figure 12C:
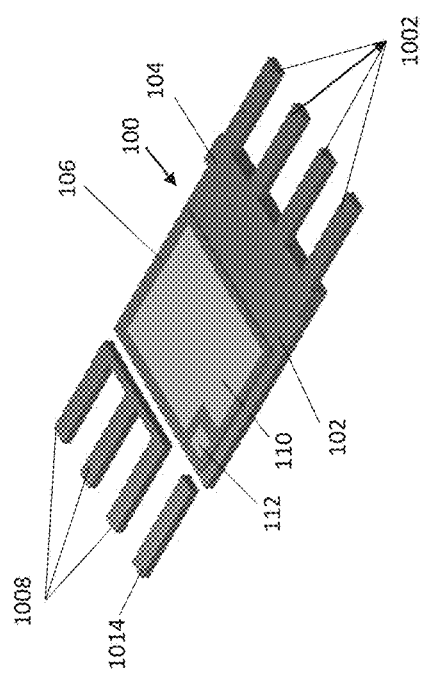

FIG. 12C illustrates the same top perspective view as FIG. 12A, after a semiconductor die 106 is attached to the base region 102 of the leadframe 100. FIG. 12D illustrates the corresponding side view post die attach. The semiconductor die 106 may be attached to the base region 102 of the leadframe 100 using any die attach material or process, as previously described herein, and more than one semiconductor die 106 may be attached to the same base region 102 of the leadframe 100 and/or the semiconductor package may include more than one leadframe 102 with one or more semiconductor dies 106 attached to each the base region 102 of each leadframe 100. In the case of a power transistor, a first (drain/collector) load terminal 108 at the back side of the die 106 is attached to the base region 102 of the leadframe 100 and a second (source/emitter) load terminal 110 and a (gate) control terminal 112 are disposed at the opposite side of the die 106 as the drain/collector terminal 108. The lead region 104 of the leadframe 100 brings an electrical connection for the first load terminal 108 at the back side of the die 106 to the same side of the package as the second load terminal 110 and the control terminal 112, so that the package has a source-down mounting configuration. The package may instead have a drain-down mounting configuration, e.g., as previously described herein in connection with FIGS. 6A through 6C.

Figure 12G:
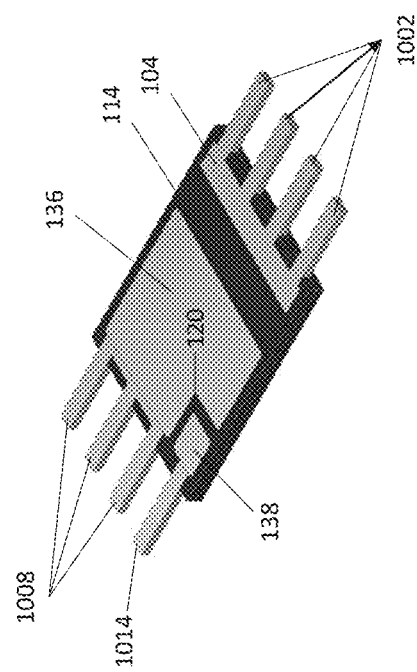
Figure 12E:
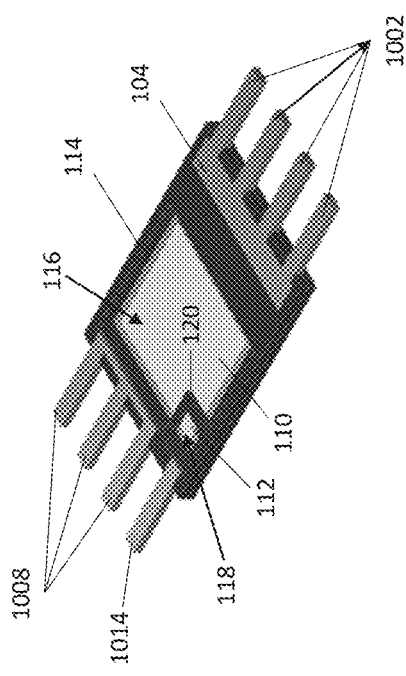

FIG. 12E illustrates the same top perspective view as FIG. 12C, after encapsulating the semiconductor die 106 in a laser-activatable mold compound 114. The base region 102 of the leadframe 100 is at least partly exposed from the laser-activatable mold compound 114 at the bottom side of the semiconductor package, and the second load terminal 110 and the control terminal 112 at the opposite side of the die 106 are at least partly exposed from the laser-activatable mold compound 114 at the front side of the semiconductor package.

Figure 12F:
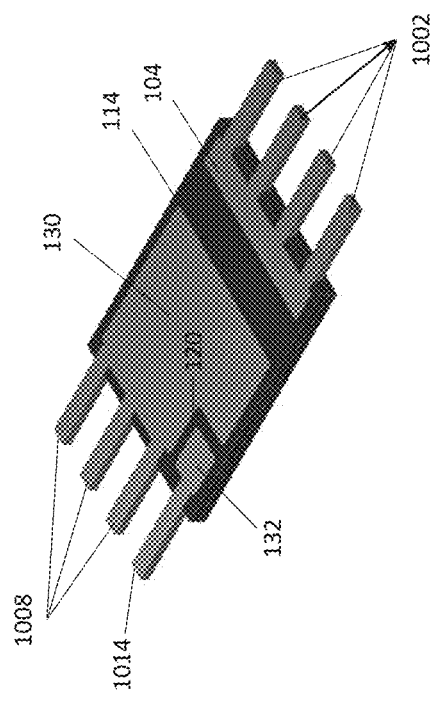

FIG. 12F illustrates the same top perspective view as FIG. 12E, after laser activating first and second regions (out of view) of the laser-activatable mold compound 114 bordering the second load terminal 110 and the control terminal 112, respectively, at the front side of the semiconductor die 106, and after plating the laser-activated regions with an electrically conductive material 130,132 to complete the respective electrical connections to the second load terminal 110 and the control terminal 112 at the front side of the semiconductor die 106.

FIG. 12G illustrates an alternative to what is shown in FIG. 12F. According to the embodiment illustrated in FIG. 12G, a first cavity 116 in the laser-activatable mold compound 114 is filled with an electrically conductive paste 136 such as solder paste which is solidified to complete the electrical connection to the second load terminal 110 at the front side of the semiconductor die 106. Similarly, a second cavity 118 in the laser-activatable mold compound 114 is also filled with an electrically conductive paste 138 such as solder paste which is solidified to complete the electrical connection to the control terminal 112 at the front side of the semiconductor die 106. The electrically conductive paste 136,138 may be applied directly to the second load terminal 110 and the control terminal 110 at the front side of the semiconductor die 106, or the second load terminal 110 and the control terminal 110 may be plated, e.g., with 5 to 10 um of metal followed by filling with the electrically conductive paste 136, 138.

Figure 13C:
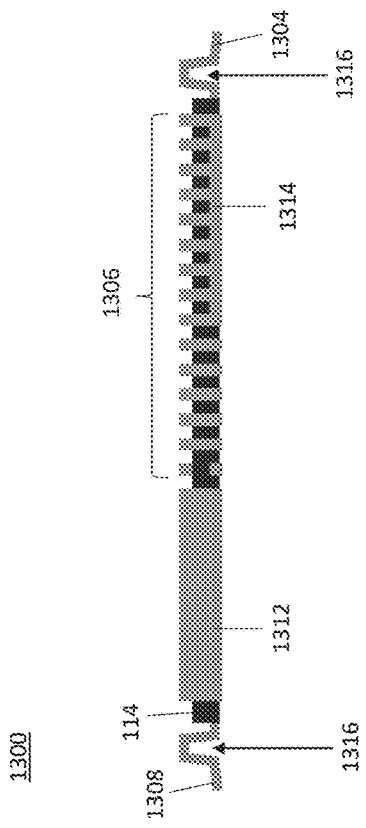
FIGS. 13A through 13D illustrate different views of another embodiment of a molded semiconductor package which may be produced by the method illustrated in FIGS. 1A through 1H or the method illustrated in FIGS. 12A through 12G.
Figure 13D:
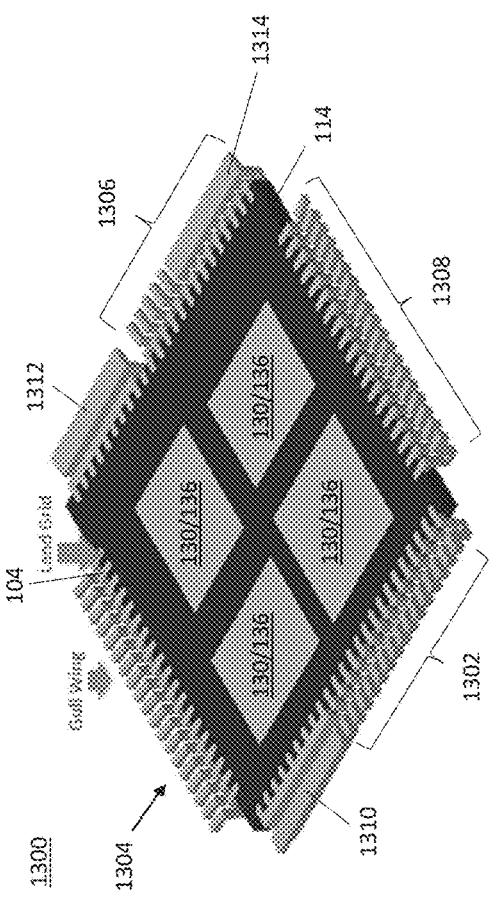
Figure 13A:
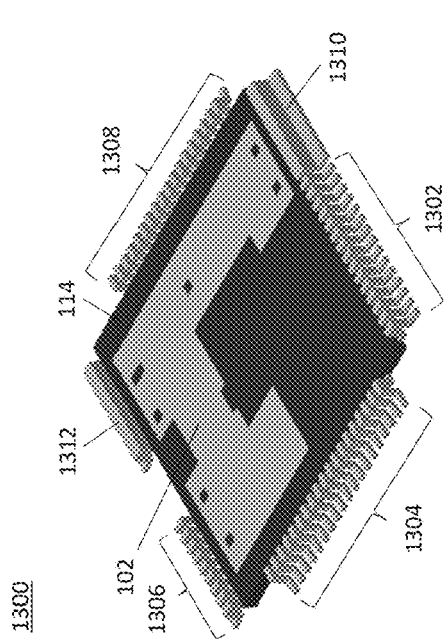
Figure 13B:
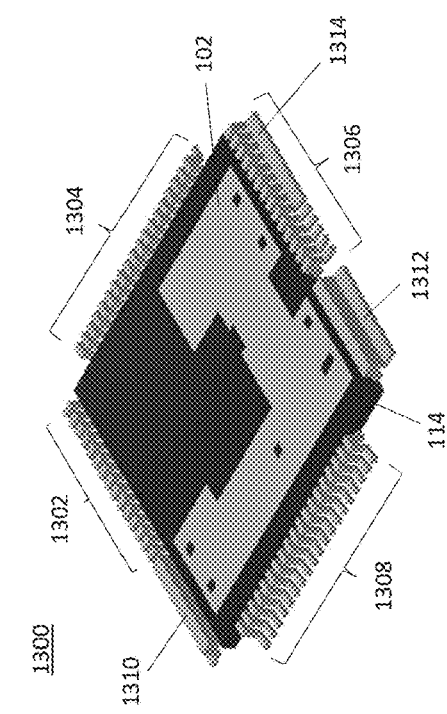

FIGS. 13A through 13D illustrate different views of another embodiment of a molded semiconductor package 1300 which may be produced by the method illustrated in FIGS. 1A through 1H or the method illustrated in FIGS. 12A through 12G. FIG. 13A illustrates a first top perspective view of the molded semiconductor package 1300, FIG. 13B illustrates a second top perspective view of the molded semiconductor package 1300, FIG. 13C illustrates a side view of the molded semiconductor package 1300, and FIG. 13D illustrates a bottom perspective view of the molded semiconductor package 1300. The molded semiconductor package 1300 includes six switch devices arranged in a B6-Bridge configuration and a corresponding controller, where each leg is formed by two switch devices coupled in series at a common switch (phase) node. The three legs are coupled between two power nodes, and each leg switch node forms an output of the molded semiconductor package 1300. The molded semiconductor package 1300 also includes groups of different leads which provide the semiconductor package 1300 with gull wing leads and/or land grid terminals such as leads/terminals 1302, 1304, 1306, 1308 and power leads/terminals 1310, 1312 for providing corresponding control, output and power connections to the switch devices included in the package 1300. Some leads/terminals of one or more groups of the leads/terminals 1302, 1304, 1306, 1308 may be joined together to form a common contact pad 1314. Some leads/terminals 1302, 1304, 1306, 1308 may be bent so as to comprise at least one folded fin 1316. As with other embodiments described herein, some leads/terminals 1302, 1304, 1306, 1308 may form gull wing pads (labelled "Gull Wing" in FIG. 13D) and the adjoining metallized region 104 of the leadframe 100 and/or laser activated region of the mold compound 114 may form land grid pads (labelled "Land Grid" in FIG. 13D) so as to provide both gull wing and land grid type connections to the same part of the package 1300.

Although the present disclosure is not so limited, the following numbered examples demonstrate one or more aspects of the disclosure.

Example 1. A method of producing a molded semiconductor package, the method comprising: attaching a first load terminal at a first side of a semiconductor die to a leadframe, the semiconductor die having a second load terminal at a second side opposite the first side and a control terminal at the first side or the second side; encapsulating the semiconductor die in a laser-activatable mold compound so that the leadframe is at least partly exposed from the laser-activatable mold compound at a first side of the molded semiconductor package, and the second load terminal is at least partly exposed from the laser-activatable mold compound at a second side of the molded semiconductor package opposite the first side; and laser activating a first region of the laser-activatable mold compound to form a first laser-activated region which forms part of an electrical connection to the second load terminal.

Example 2. The method of example 1, wherein encapsulating the semiconductor die in the laser-activatable mold compound comprises: forming a first cavity in the laser-activatable mold compound which exposes at least part of the second load terminal at the second side of the molded semiconductor package.

Example 3. The method of example 2, further comprising: filling the first cavity in the laser-activatable mold compound with an electrically conductive paste; and solidifying the electrically conductive paste, to complete the electrical connection between the first laser-activated region and the second load terminal.

Example 4. The method of example 2, further comprising: plating the part of the second load terminal exposed by the first cavity in the laser-activatable mold compound, to complete the electrical connection between the first laser-activated region and the second load terminal.

Example 5. The method of example 2, wherein the control terminal is at the second side of the semiconductor die, and wherein encapsulating the semiconductor die in the laser-activatable mold compound comprises: forming a second cavity in the laser-activatable mold compound which exposes at least part of the control terminal at the second side of the molded semiconductor package, wherein the first and the second cavities are separated from one another by a section of the laser-activatable mold compound formed on the second side of the semiconductor die between the second load terminal and the control terminal.

Example 6. The method of any of examples 1 through 5, wherein the control terminal is at the second side of the semiconductor die, the method further comprising: laser activating a second region of the laser-activatable mold compound to form a second laser-activated region which forms part of an electrical connection to the control terminal.

Example 7. The method of any of examples 1 through 5, wherein the control terminal is at the first side of the semiconductor die, and the method further comprising: attaching a metal lead to the control terminal, wherein a vertical extension of the leadframe brings an electrical connection for the first load terminal from the first side of the molded semiconductor package to the second side of the molded semiconductor package, wherein a vertical extension of the metal lead brings an electrical connection for the control terminal from the first side of the molded semiconductor package to the second side of the molded semiconductor package.

Example 8. The method of any of examples 1 through 7, wherein laser activating the first region of the laser-activatable mold compound comprises: laser activating a plurality of notches formed in the edge of the laser-activatable mold compound; and laser activating a section of the laser-activatable mold compound interposed between the plurality of notches and the second load terminal.

Example 9. The method of any of examples 1 through 8, further comprising: patterning the exposed part of the leadframe at the first side of the molded semiconductor package to increase thermal efficiency of the leadframe.

Example 10. The method of any of examples 1 through 9, further comprising: attaching a first load terminal at a first side of an additional semiconductor die to an additional leadframe, the additional semiconductor die having a second load terminal at a second side opposite the first side and a control terminal at the first side or the second side; encapsulating the additional semiconductor die in the laser-activatable mold compound so that the additional leadframe is at least partly exposed from the laser-activatable mold compound at the first side of the molded semiconductor package, and the second load terminal of the additional semiconductor die is at least partly exposed from the laser-activatable mold compound at the second side of the molded semiconductor package; laser activating an additional region of the laser-activatable mold compound to form an additional laser-activated region which forms part of an electrical connection to the second load terminal of the additional semiconductor die.

Example 11. A molded semiconductor package, comprising: a semiconductor die having a first load terminal at a first side, a second load terminal at a second side opposite the first side, and a control terminal at the first side or the second side; a leadframe attached to the first load terminal of the semiconductor die; and a laser-activatable mold compound encapsulating the semiconductor die so that the leadframe is at least partly exposed from the laser-activatable mold compound at a first side of the molded semiconductor package, and the second load terminal is at least partly exposed from the laser-activatable mold compound at a second side of the molded semiconductor package opposite the first side, wherein the laser-activatable mold compound comprises a first laser-activated region which forms part of an electrical connection to the second load terminal.

Example 12. The molded semiconductor package of example 11, wherein a first cavity in the laser-activatable mold compound exposes at least part of the second load terminal at the second side of the molded semiconductor package, and wherein the first cavity is filled with a solidified electrically conductive paste and/or a plated metal to complete the electrical connection between the first laser-activated region and the second load terminal.

Example 13. The molded semiconductor package of example 11, wherein the second load terminal comprises a Cu pillar attached to a bond pad at the second side of the semiconductor die and the first laser-activated region contacts the Cu pillar to complete the electrical connection to the second load terminal, or wherein the first laser-activated region contacts the bond pad to complete the electrical connection to the second load terminal.

Example 14. The molded semiconductor package of any of examples 11 through 13, wherein the first load terminal of the semiconductor die is attached to a thinner region of the leadframe, wherein the leadframe has a thicker region adjoining the thinner region, and wherein the semiconductor die is encapsulated in the laser-activatable mold compound so that the thicker region of the leadframe is at least partly exposed from the laser-activatable mold compound at the second side of the molded semiconductor package.

Example 15. The molded semiconductor package of any of examples 11 through 14, wherein the leadframe comprises a plurality of first leads which protrude from a first side face of the molded semiconductor package, and wherein each of the first leads is bent so as to comprise at least one folded fin.

Example 16. The molded semiconductor package of example 15, wherein the plurality of first leads is electrically connected to the first load terminal and forms a gull wing pad, and wherein the second load terminal forms a land grid pad.

Example 17. The molded semiconductor package of example 15, wherein the plurality of first leads forms a gull wing pad, and wherein a metallized region of the leadframe and/or a laser activated region of the mold compound adjoining the plurality of first leads forms a land grid pad to provide both gull wing and land grid type connections to a same part of the molded semiconductor package Example 18. The molded semiconductor package of examples 15 through 17, wherein at least some leads of the plurality of first leads are joined together to form a common contact pad.

Example 19. The molded semiconductor package of any of examples 15 through 19, further comprising: a plurality of second leads encapsulated in the laser-activatable mold compound and electrically connected to the first laser-activated region of the laser-activatable mold compound, wherein the plurality of second leads protrude from a second side face of the molded semiconductor package, wherein each of the plurality of second leads is bent so as to comprise at least one folded fin.

Example 20. The molded semiconductor package of any of examples 11 through 17, further comprising: an additional semiconductor die having a first load terminal at a first side, a second load terminal at a second side opposite the first side, and a control terminal at the first side or the second side; and an additional leadframe attached to the first load terminal of the additional semiconductor die, wherein the additional semiconductor die is encapsulated in the laser-activatable mold compound so that the additional leadframe is at least partly exposed from the laser-activatable mold compound at the first side of the molded semiconductor package, and the second load terminal of the additional semiconductor die is at least partly exposed from the laser-activatable mold compound at the second side of the molded semiconductor package, wherein the laser-activatable mold compound comprises an additional laser-activated region which forms part of an electrical connection to the second load terminal of the additional semiconductor die.

Example 21. The molded semiconductor package of example 20, wherein the semiconductor die and the additional semiconductor die form part of separate channels configured to deliver current to a load.

Example 22. The molded semiconductor package of example 20, wherein the semiconductor die and the additional semiconductor die are electrically coupled in a half bridge configuration.

Example 23. The molded semiconductor package of any of examples 11 through 22, wherein the semiconductor die is a power semiconductor die, wherein the first load terminal is a drain terminal, wherein the second load terminal is a source terminal, wherein the control terminal is at the second side of the semiconductor die, and wherein a vertical extension of the leadframe brings an electrical connection for the drain terminal from the first side of the molded semiconductor package to the second side of the molded semiconductor package, so that the molded semiconductor package has a source-down mounting configuration at the second side of the molded semiconductor package.

Example 24. The molded semiconductor package of any of examples 11 through 22, wherein the semiconductor die is a power semiconductor die, wherein the first load terminal is a source terminal, wherein the second load terminal is a drain terminal, wherein the control terminal is at the first side of the semiconductor die, and wherein a vertical extension of the leadframe brings an electrical connection for the source terminal from the first side of the molded semiconductor package to the second side of the molded semiconductor package, so that the molded semiconductor package has a drain-down mounting configuration at the second side of the molded semiconductor package.

Example 25. The molded semiconductor package of any of examples 11 through 24, wherein the second load terminal comprises a metal pillar build up or attached to a bond pad at the second side of the semiconductor die and the first laser-activated region contacts the metal pillar to complete the electrical connection to the second load terminal.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of producing a molded semiconductor package, the method comprising:
    attaching a first load terminal at a first side of a semiconductor die to a leadframe, the semiconductor die having a second load terminal at a second side opposite the first side and a control terminal at the first side or the second side;
    encapsulating the semiconductor die in a laser-activatable mold compound so that the leadframe is at least partly exposed from the laser-activatable mold compound at a first side of the molded semiconductor package, and the second load terminal is at least partly exposed from the laser-activatable mold compound at a second side of the molded semiconductor package opposite the first side; and
    laser activating a first region of the laser-activatable mold compound to form a first laser-activated region that is electrically conductive.

2. The method of claim 1, further comprising:
    plating a part of the second load terminal exposed by a first cavity in the laser-activatable mold compound and the first laser-activated region to form a connection to the second load terminal.

3. The method of claim 1, wherein encapsulating the semiconductor die in the laser-activatable mold compound comprises:
    forming a first cavity in the laser-activatable mold compound which exposes at least part of the second load terminal at the second side of the molded semiconductor package.

4. The method of claim 3, further comprising:
    filling the first cavity in the laser-activatable mold compound with an electrically conductive paste; and
    solidifying the electrically conductive paste, to complete an electrical connection between the first laser-activated region and the second load terminal.

5. The method of claim 3, wherein the control terminal is at the second side of the semiconductor die, and wherein encapsulating the semiconductor die in the laser-activatable mold compound comprises:
    forming a second cavity in the laser-activatable mold compound which exposes at least part of the control terminal at the second side of the molded semiconductor package,
    wherein the first and the second cavities are separated from one another by a section of the laser-activatable mold compound formed on the second side of the semiconductor die between the second load terminal and the control terminal.

6. The method of claim 1, wherein the control terminal is at the second side of the semiconductor die, the method further comprising:
    laser activating a second region of the laser-activatable mold compound to form a second laser-activated region that is electrically conductive.

7. The method of claim 1, wherein the control terminal is at the first side of the semiconductor die, and the method further comprising:
    attaching a metal lead to the control terminal,
    wherein a vertical extension of the leadframe brings an electrical connection for the first load terminal from the first side of the molded semiconductor package to the second side of the molded semiconductor package,
    wherein a vertical extension of the metal lead brings an electrical connection for the control terminal from the first side of the molded semiconductor package to the second side of the molded semiconductor package.

8. The method of claim 1, wherein laser activating the first region of the laser-activatable mold compound comprises:
    laser activating a plurality of notches formed in the edge of the laser-activatable mold compound; and
    laser activating a section of the laser-activatable mold compound interposed between the plurality of notches and the second load terminal.

9. The method of claim 1, further comprising:
    patterning the exposed part of the leadframe at the first side of the molded semiconductor package to increase thermal efficiency of the leadframe.

10. The method of claim 1, further comprising:
    attaching a first load terminal at a first side of an additional semiconductor die to an additional leadframe, the additional semiconductor die having a second load terminal at a second side opposite the first side and a control terminal at the first side or the second side;
    encapsulating the additional semiconductor die in the laser-activatable mold compound so that the additional leadframe is at least partly exposed from the laser-activatable mold compound at the first side of the molded semiconductor package, and the second load terminal of the additional semiconductor die is at least partly exposed from the laser-activatable mold compound at the second side of the molded semiconductor package; and
    laser activating an additional region of the laser-activatable mold compound to form an additional laser-activated region that is electrically conductive.

11. A molded semiconductor package, comprising:
    a semiconductor die having a first load terminal at a first side, a second load terminal at a second side opposite the first side, and a control terminal at the first side or the second side;
    a leadframe attached to the first load terminal of the semiconductor die; and a laser-activatable mold compound encapsulating the semiconductor die so that the leadframe is at least partly exposed from the laser-activatable mold compound at a first side of the molded semiconductor package, and the second load terminal is at least partly exposed from the laser-activatable mold compound at a second side of the molded semiconductor package opposite the first side, wherein the laser-activatable mold compound comprises a first laser-activated region that is electrically conductive.

12. The molded semiconductor package of claim 11, wherein a first cavity in the laser-activatable mold compound exposes at least part of the second load terminal at the second side of the molded semiconductor package, and wherein the first cavity is filled with a solidified electrically conductive paste and/or a plated metal to complete an electrical connection between the first laser-activated region and the second load terminal.

13. The molded semiconductor package of claim 11, wherein the second load terminal comprises a Cu pillar attached to a bond pad at the second side of the semiconductor die and the first laser-activated region contacts the Cu pillar to complete the electrical connection to the second load terminal, or wherein the first laser-activated region contacts the bond pad to complete an electrical connection to the second load terminal.

14. The molded semiconductor package of claim 11, wherein the first load terminal of the semiconductor die is attached to a thinner region of the leadframe, wherein the leadframe has a thicker region adjoining the thinner region, and wherein the semiconductor die is encapsulated in the laser-activatable mold compound so that the thicker region of the leadframe is at least partly exposed from the laser-activatable mold compound at the second side of the molded semiconductor package.

15. The molded semiconductor package of claim 11, wherein the leadframe comprises a plurality of first leads which protrude from a first side face of the molded semiconductor package, and wherein each of the first leads is bent so as to comprise at least one folded fin.

16. The molded semiconductor package of claim 15, wherein the plurality of first leads forms a gull wing pad, and wherein a metallized region of the leadframe and/or a laser activated region of the mold compound adjoining the plurality of first leads forms a land grid pad so as to provide both gull wing and land grid type connections to a same part of the molded semiconductor package.

17. The molded semiconductor package of claim 15, further comprising:
a plurality of second leads encapsulated in the laser-activatable mold compound and electrically connected to the first laser-activated region of the laser-activatable mold compound,
wherein the plurality of second leads protrude from a second side face of the molded semiconductor package,
wherein each of the plurality of second leads is bent so as to comprise at least one folded fin.

18. The molded semiconductor package of claim 11, further comprising:
an additional semiconductor die having a first load terminal at a first side, a second load terminal at a second side opposite the first side, and a control terminal at the first side or the second side; and
an additional leadframe attached to the first load terminal of the additional semiconductor die,
wherein the additional semiconductor die is encapsulated in the laser-activatable mold compound so that the additional leadframe is at least partly exposed from the laser-activatable mold compound at the first side of the molded semiconductor package, and the second load terminal of the additional semiconductor die is at least partly exposed from the laser-activatable mold compound at the second side of the molded semiconductor package,
wherein the laser-activatable mold compound comprises an additional laser-activated region that is electrically conductive.

19. The molded semiconductor package of claim 18, wherein the semiconductor die and the additional semiconductor die form part of separate channels configured to deliver current to a load or are electrically coupled in a half bridge configuration.

20. The molded semiconductor package of claim 11, wherein the second load terminal comprises a metal pillar build up or attached to a bond pad at the second side of the semiconductor die and the first laser-activated region contacts the metal pillar to complete an electrical connection to the second load terminal.

* * * * *